US008895451B2

(12) United States Patent
Seiler et al.

(10) Patent No.: US 8,895,451 B2
(45) Date of Patent: Nov. 25, 2014

(54) METHOD FOR ETCHING MICRO-ELECTRICAL FILMS USING A LASER BEAM

(71) Applicant: Commissariat a l'Energie Atomique et aux Energies Alternatives, Paris (FR)

(72) Inventors: Anne-Laure Seiler, Seyssinet Pariset (FR); Mohammed Benwadih, Champigny sur Marne (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/915,162

(22) Filed: Jun. 11, 2013

(65) Prior Publication Data
US 2013/0295715 A1 Nov. 7, 2013

Related U.S. Application Data

(63) Continuation of application No. PCT/FR2011/052902, filed on Dec. 8, 2011.

(30) Foreign Application Priority Data

Jan. 17, 2011 (FR) ...................... 11 50350

(51) Int. Cl.
*H01L 21/302* (2006.01)
*H01L 51/00* (2006.01)
*H01L 51/10* (2006.01)
*H01L 51/05* (2006.01)
*H01L 21/311* (2006.01)

(52) U.S. Cl.
CPC ........ *H01L 51/0017* (2013.01); *H01L 51/0023* (2013.01); *H01L 51/0508* (2013.01); *H01L 21/31127* (2013.01); *H01L 51/102* (2013.01)
USPC .......................................... 438/707; 438/725

(58) Field of Classification Search
CPC ............ H01L 21/0331; H01L 21/0332; H01L 51/0016; H01L 51/0017; H01L 51/102; H01L 51/0023; H01L 51/0009
USPC ................................................... 438/707, 725
See application file for complete search history.

(56) References Cited

U.S. PATENT DOCUMENTS

2007/0040169 A1    2/2007  Kim et al.
2011/0101326 A1*   5/2011  Nagamatsu et al. ............ 257/40
2011/0232954 A1*   9/2011  Sirringhaus et al. .......... 174/260

OTHER PUBLICATIONS

Kim et al. "Low-Leakage Polymeric Thin-Film Transistors Fabricated by Laser Assisted Lift-Off Technique," Japanese Journal of Applied Physics, Japan Society of Applied Physics, JP, vol. 44, No. 33-36, dated Jan. 1, 2005 (pp. L1109-L1111).
International Search Report, International Application No. PCT/FR2011/052902, dated Mar. 28 2012 (2 pages).

* cited by examiner

*Primary Examiner* — William D Coleman
(74) *Attorney, Agent, or Firm* — Burr & Brown, PLLC

(57) ABSTRACT

A method for etching with a laser beam having a predetermined wavelength an area of a layer of a first material, said area being deposited at the surface of at least two second materials, includes: depositing a layer of a third material on the layer of the first material, the first and the third materials having a chemical affinity on application of the laser beam greater than the chemical affinity during said application between the first material and each of said at least two second materials; and applying the laser beam to an area of a free surface of the layer of third material vertically above the area of the layer of first material with a fluence of said laser beam causing the separation of said area.

12 Claims, 1 Drawing Sheet

METHOD FOR ETCHING MICRO-ELECTRICAL FILMS USING A LASER BEAM

FIELD OF THE INVENTION

The invention relates to the field of laser etching, such as implemented in microelectronic component manufacturing methods.

BACKGROUND

Laser etching is a known method to remove a layer of material deposited at the surface of another material. By irradiating the layer of material to be removed, the electromagnetic energy heats up the surface thereof, after which the heat propagates all the way to the interface between the two materials where it is stored until a blister forms. The layer of material to be removed thus separates from the material supporting it.

The energy necessary for the separation characterized by the fluence received from the laser, the irradiation time, and the laser wavelength, or equivalently by the surface power, the irradiation time, and the laser wavelength, depends on the characteristics of the layer of material to be removed and on the characteristics of the material having this layer deposited thereon. The properties of the laser thus have to be adapted to each specific case.

Now, it is frequent for a layer of material to be removed to be deposited on two different materials. For example, on manufacturing of an organic transistor, the metal drain and source electrodes, usually made of gold, are deposited on a plastic substrate, after which an organic semiconductor layer having a thickness of some hundred nanometers is deposited and covers the assembly. At this stage of the manufacturing, the electrodes then need to be exposed. However, irradiating the semiconductor layer with a fluence and an irradiation time selected to separate the portion of semiconductor layer deposited on the plastic substrate also deteriorates the metal electrodes, or even separates them from the plastic substrate.

Thus, for example, to separate a 100-nanometer semiconductor layer deposited on a polyethylene naphthalate (PEN) substrate, a minimum fluence of 70 mJ/cm$^2$ is required for an irradiation of 30 nanoseconds with a laser at 245 nanometers. Now, such an irradiation is incompatible with gold drain and source electrodes deposited on the substrate since these electrodes are deteriorated as soon as the fluence is greater than 55 mJ/cm$^2$. It is thus impossible to separate both the portion of semiconductor layer deposited on the plastic substrate and the portion of semiconductor layer deposited on the metal electrodes by means of one and the same irradiation applied to the entire organic semiconductor layer. Usually, this layer is thus removed by means of a chemical processing, which has the disadvantage of leaving residues.

SUMMARY OF THE INVENTION

The present invention aims at providing a laser etching method which decreases the laser energy necessary to separate a first material deposited on a second material, which in particular makes it possible to separate a material deposited on two different materials.

For this purpose, the present invention aims at a method for etching with a laser beam having a predetermined wavelength an area of a layer of a first material, said area being deposited at the surface of at least two second materials, the method comprising:

depositing a layer of a third material on the layer of first material, the first and the third materials having a chemical affinity on application of the laser beam greater than the chemical affinity during said application between the first material and each of said at least two second materials; and applying the laser beam to an area of a free surface of the layer of the third material vertically above the area of the layer of the first material with a fluence of said laser beam causing the separation of said area.

In other words, it was observed that by deliberately depositing a layer which bonds to the layer of first material more strongly than the layer of first material bonds to the second materials, the minimum energy necessary to separate the layer of the first material is lower.

As described previously, to separate a layer of semiconductor material of 100 nanometers deposited on a PEN layer by directly irradiating the layer of semiconductor material, it is necessary to provide a fluence of at least 70 mJ/cm$^2$ for an irradiation of 30 nanoseconds with a 248-nanometer laser.

As an example of the invention, by depositing on a layer of organic semiconductor material a layer of 30 nanometers of fluorinated polymer, the minimum necessary fluence falls to 50 mJ/cm$^2$.

Generally, it could have been observed that there is a decrease of the minimum energy to be applied as soon as the bonding between the third material and the first material is greater than the bonding between the first material and the second materials.

According to an embodiment, the laser is an excimer laser.

According to an embodiment of the invention, the thickness of the layer of third material ranges between 1 nanometer and 1 micrometer.

According to an embodiment of the invention, the material and the thickness of the layer of third material is selected according to the fluence of the laser beam, to the nature of the first material, and to the thickness of the area of first material to be separated.

According to an embodiment of the invention, the first material is an organic semi-conductor material and the second materials respectively are a plastic material and a conductive material.

In particular, the organic semiconductor material is a fluorinated material, the conductive material is a metal or a conductive polymer, and the third material is a fluorinated polymer.

More specifically, the third material is CYTOP®, and/or the first material is TIPS, and/or the third material has an enthalpy for the bonding with the first material greater than 15 kJ·mol$^{-1}$. Further, the thickness of the layer of fluorinated polymer is substantially equal to 100 nanometers, the thickness of the layer of the first material is substantially equal to 100 nanometers, the thickness of the layer of conductive material is substantially equal to 30 nanometers, the fluence of the laser beam is lower than 50 mJ/cm$^2$; and the time of irradiation by the laser beam is substantially equal to 30 nanoseconds.

According to an embodiment of the invention, the third material has a greater absorption of the laser beam wavelength than the first material.

BRIEF DESCRIPTION OF THE DRAWINGS

The invention will be better understood on analysis of the following description, given as an example only, and made in relation with the appended drawings, where.

DETAILED DESCRIPTION OF THE INVENTION

An application of a method according to the invention tending to remove a layer of organic semiconductor material present on top of and around a metal electrode deposited on a plastic substrate, as is for example the case during the manufacturing of an organic transistor where the drain and source electrodes require being exposed for the rest of the transistor forming, will be described.

Figure 1:
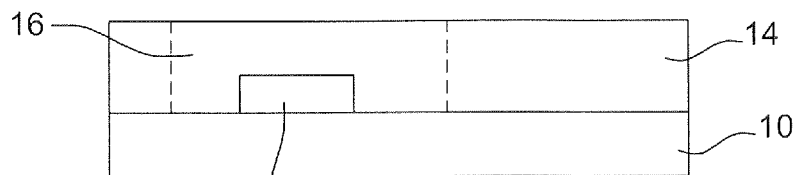
FIGS. 1 to 5 are simplified cross-section views illustrating a laser etching method according to the invention applied to the removal of an organic semiconductor layer deposited both on a plastic substrate and on a metal electrode.

FIG. 1 thus schematically illustrates in cross-section view a stack obtained during a method for manufacturing an organic transistor. This stack comprises a substrate 10 made of PEN (polyethylene naphthalate), having a drain or source electrode 12, for example, made of gold, deposited thereon, the assembly being covered with a layer of organic semiconductor material 14, for example, of the pentacene family, for example, TIPS (propylsilylethynyl pentacene), or amorphous polymers, for example, of TFB (dioctyl-fluorene-butylphenyl-diphenylamine) type. Layer 14 is thus deposited both on plastic substrate 10 and on metal electrode 12. At this stage of the manufacturing, layer 14 requires being removed from an area 16 on top of and around electrode 12.

Figure 2:
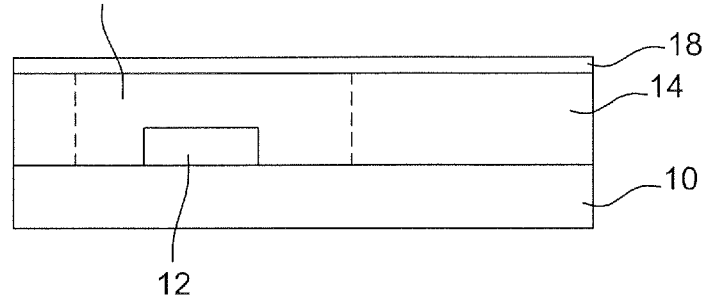

To remove portion 16 of semiconductor material layer 14 by means of an excimer UV laser beam, a method according to the invention starts with the deposition on layer 14 of a layer of a polymer, for example, fluorinated, 18, and especially a layer of CYTOP® of Asahi Glass Co. Ltd having a thickness lower than 1,000 nanometers (FIG. 2).

Fluorinated polymer layer 18 absorbs UVs, and thus the radiation originating from the laser, and its bonding to semiconductor material layer 14 very strongly increases by the development of chemical bonds having a high bonding enthalpy, for example, a bonding enthalpy of energy greater than 15 kJ·mol$^{-1}$ in the case of hydrogen bonds. Advantageously, semiconductor material 14 and/or the material of layer 18 is a fluorinated polymer.

Such a high bonding enthalpy especially results in a stronger bonding of layer 18 to layer 14 than that of layer 14 to electrode 12 and to substrate 10.

Figure 3:
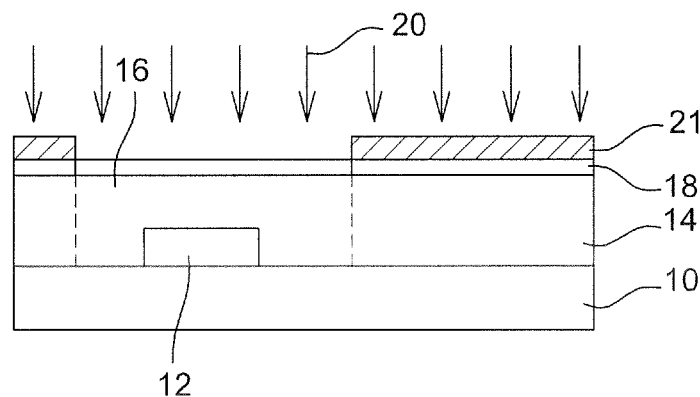

The method then carries on with the irradiation of portion 16 of semiconductor layer 14 with a laser beam 20 according to a fluence and according to an irradiation time suited to the separation of layer 14 both of gold electrode 12 and of PEN substrate 10, as discussed hereafter (FIG. 3). A mask 21 is for example deposited on layer 18 without covering the portion of layer 18 corresponding to portion 16 to be removed and laser beam 20 is submitted to a full plate irradiation.

Figure 4:
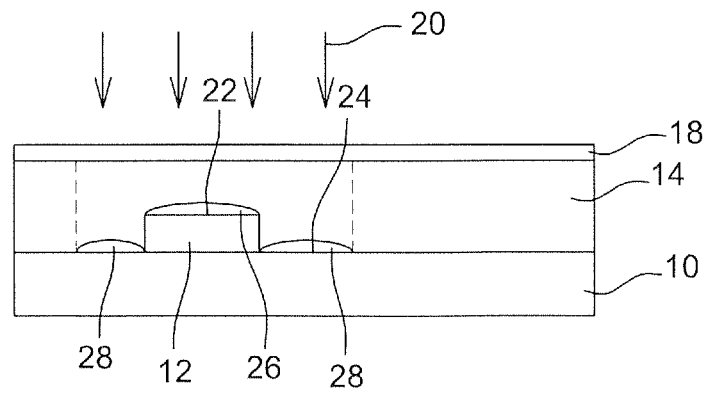

The incident electromagnetic energy is then stored at interface 22 between metal electrode 12 and semiconductor material layer 14 and at interface 24 between semiconductor material layer 14 and plastic substrate 10, so that blisters 26, 28 form at interfaces 22 and 24 (FIG. 4).

Figure 5:
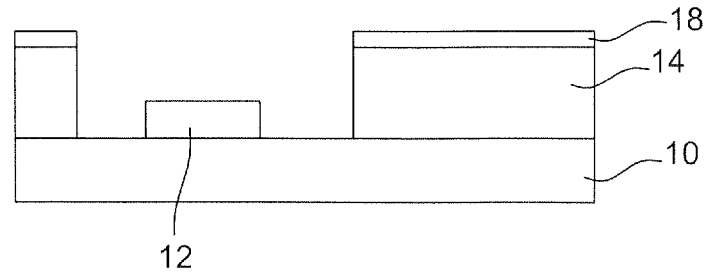

Once blisters 26, 28 have reached a critical size, the semiconductor material above them separates, which results in exposing metal electrode 12 without leaving residues of semiconductor material (FIG. 5). Mask 21 and/or layer 18 are then removed.

For a semiconductor material layer 14 having a 100-nanometer thickness, a metal electrode 22 having a 30-nanometer thickness, and a laser having a wavelength of 245 nanometers generating a laser pulse of 30 nanoseconds:

if the thickness of layer 18 ranges between 1 and 50 nanometers, a minimum fluence ranging between 30 and 40 mJ·cm$^2$ is necessary to separate semiconductor layer 14 both from metal electrode 12 and from plastic substrate 10. No damage to metal electrode 12 can be observed;

if the thickness of layer 18 ranges between 50 and 100 nanometers, a minimum fluence ranging between 40 and 50 mJ·cm$^2$ is necessary to separate semiconductor layer 14 both from metal electrode 12 and from plastic substrate 10. Here again, no damage to metal electrode 12 can be observed; and if the thickness of layer 18 is greater than 100 nanometers, a minimum fluence ranging between 50 and 70 mJ·cm$^2$ is necessary to separate semiconductor layer 14 both from metal electrode 12 and from plastic substrate 10. For fluences greater than 55 mJ·cm$^2$, some damage to metal electrode 12 can be observed.

Accordingly, the thickness of layer 18 is selected to be lower than 100 nanometers and the laser beam is set for a fluence lower than 50 mJ·cm$^2$.

This value of the fluence should be compared with the 70 mJ·cm$^2$ value which is the minimum fluence necessary to remove a portion of semiconductor material layer deposited on plastic substrate 10 in the absence of fluorinated polymer layer 18.

It could thus be observed that the designer has at least two parameters relative to layer 18 to adjust the laser fluence to a value which does not damage metal electrode 12, that is:

the nature of the material of layer 18 which defines the "intensity" of the bonding between layer 18 and semiconductor layer 14; and the thickness of layer 18 which also adjusts the intensity of a mechanism, in all likelihood, as mentioned hereabove, of vibratory nature, which helps the separation of layer 14.

It has already been observed that for an equal bonding, the minimum fluence decreases as the absorption of the laser radiation by layer 18 increases.

Preferably, the material of layer 18 is selected to bond as strongly as possible to the layer of semiconductor material to obtain the highest possible difference between, on the one hand, the bonding of layer 18 and of semiconductor material layer 14, and on the other hand, the bonding of layer 14 with the other materials on which it is deposited, since the fluence is adjusted by the thickness of layer 18. Indeed, the more strongly layer 18 bonds to layer 14 and the more the minimum fluence necessary to separate layer 14 decreases. The range of usable fluences is thus higher.

Generally, a decrease in the energy necessary for the separation can be observed as soon as a stronger bonding layer of material is deposited on a layer to be removed, this layer being itself deposited on one or several materials.

For example, although the above-described example relate to an organic semiconductor layer, the invention also works with layers of organic insulator, such as for example a SiO$_2$, TiO$_2$, or Al$_2$O$_3$ layer. Similarly, the invention also works with electrodes formed of another conductive material than gold, like for example electrodes made of Ni, Cu, or of conductive polymer (for example, PDOT). Similarly, the invention works with substrates made of other types of plastic than PEN, such as for example substrates made of PET (polyethylene-terephthalate) or of Kafton® (based on polyimide).

It should be noted that the above-described embodiment relates to the removal of a layer deposited on two materials. It should be understood that the invention also applies to the case of the removal of a layer deposited on a single material, for example, and without this being a limitation, to the case of a layer of organic semiconductor material deposited on a plastic substrate. Indeed, the simple fact of providing an appropriate layer 18 results in decreasing the minimum energy necessary for the separation, which may be advantageous, for example, in terms of laser equipment and of optics.

It should also be noted that the relations between the different involved bondings need not be established before the irradiation. Such relations may be materialized during the very application of the irradiation under the effect thereof, for example, due to a modification of the bonds between the different materials. Indeed, these relations should be verified at the time of the separation, and the fact for these relations not to be verified before application of the irradiation matters little.

Similarly, the nature of the material of the layer deposited on the layer to be removed and/or its thickness may be selected to obtain a slight difference, for example, due to manufacturing costs and constraints. In this case, the minimum energy necessary for the separation will be higher and will most likely result in a degradation of one of the materials. However, due to the sole decrease, even minute, of the energy to be brought, such a degradation will thus be minimized with respect to that observed in the state of the art.

The invention claimed is:

1. A method for etching with a laser beam having a predetermined wavelength an area of a layer of a first material, said area being deposited at the surface of at least two second materials, wherein said method comprises:
   depositing a layer of a third material on the layer of the first material, the first and the third materials having a chemical affinity on application of the laser beam greater than the chemical affinity during said application between the first material and each of said at least two second materials; and
   applying the laser beam to an area of a free surface of the layer of third material vertically above the area of the layer of first material with a fluence of said laser beam causing the separation of said area.

2. The method for etching with a laser beam of claim 1, wherein the laser is an excimer laser.

3. The method for etching with a laser beam of claim 1, wherein the thickness of the layer of third material ranges between 1 nanometer and 1 micrometer.

4. The method for etching with a laser beam of claim 1, wherein the nature and the thickness of the layer of third material are selected according to the fluence of the laser beam, to the nature of the first material, and to the thickness of the area of the first material to be separated.

5. The method for etching with a laser beam of claim 1, wherein the first material is an organic semiconductor material and wherein the second materials respectively are a plastic material and a conductive material.

6. The method for etching with a laser beam of claim 1, wherein the third material has a greater absorption of the laser beam wavelength greater than the first material.

7. The method for etching with a laser beam of claim 5, wherein the organic semiconductor material is a fluorinated material, in that the conductive material is a metal or a conductive polymer, and wherein the third material is a fluorinated polymer.

8. The method for etching with a laser beam of claim 5, wherein the conductive material is gold or PDOT.

9. The method for etching with a laser beam of claim 5, wherein the third material is CYTOP® and/or the first material is TIPS.

10. The method for etching with a laser beam of claim 5, wherein the third material has a bonding enthalpy on application of the laser beam with the first material greater than 15 kJ·mol$^{-1}$.

11. The method for etching with a laser beam of claim 9,
   wherein the thickness of the fluorinated polymer layer is substantially equal to 100 nanometers;
   wherein the thickness of the layer of first material is substantially equal to 100 nanometers;
   wherein the thickness of the layer of conductive material is substantially equal to 30 nanometers;
   wherein the fluence of the laser beam is lower than 50 mJ/cm$^2$; and
   wherein the time of irradiation by the laser beam is substantially equal to 30 nanoseconds.

12. The method for etching with a laser beam of claim 10, wherein the thickness of the fluorinated polymer layer is substantially equal to 100 nanometers;
   wherein the thickness of the layer of first material is substantially equal to 100 nanometers;
   wherein the thickness of the layer of conductive material is substantially equal to 30 nanometers;
   wherein the fluence of the laser beam is lower than 50 mJ/cm$^2$; and
   wherein the time of irradiation by the laser beam is substantially equal to 30 nanoseconds.

* * * * *